(12) United States Patent
Lee

(10) Patent No.: US 6,524,925 B1
(45) Date of Patent: Feb. 25, 2003

(54) METHOD OF FORMING A THIN-FILM RESISTOR IN A SEMICONDUCTOR WAFER

(75) Inventor: Jia-Sheng Lee, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/330,040

(22) Filed: Jun. 11, 1999

(51) Int. Cl.[7] .................................................. H01L 21/20
(52) U.S. Cl. ........................................ 438/384; 438/381
(58) Field of Search ................................. 438/381, 382, 438/384, 238, 329, 330, 680, 675, 706, 745

(56) References Cited

U.S. PATENT DOCUMENTS

| | | | | |
|---|---|---|---|---|
| 5,284,794 A | * | 2/1994 | Isobe et al. ................. | 438/680 |
| 6,207,521 B1 | * | 3/2001 | Lee ............................. | 438/384 |
| 6,225,183 B1 | * | 5/2001 | Lee ............................. | 438/384 |
| 6,272,736 B1 | * | 8/2001 | Lee ............................. | 29/620 |

* cited by examiner

*Primary Examiner*—David Nelms
*Assistant Examiner*—David Nhu
(74) *Attorney, Agent, or Firm*—Winston Hsu

(57) ABSTRACT

The present invention provides a method of forming a thin-film resistor on a dielectric layer of a semiconductor wafer. First, a resistance layer, a buffering layer and a protective layer are formed in a predetermined area of the dielectric layer. Then, an insulating layer is formed on the semiconductor wafer to cover the upper and side surface of the protective layer, the side surface of the buffering layer and the resistance layer, and the surface of the dielectric layer outside of the predetermined area. Next, two openings extending down to the protective layer are formed by performing a dry-etching process on the insulating layer. Later, two openings extending down to the buffering layer are formed by performing a first wet-etching process on the protective layer below the two openings of the insulating layer. Next, two openings extending down to the resistance layer are formed by performing a second wet-etching process on the buffering layer below the two openings of the protective layer. Finally, two conductive layers are formed in the two openings to contact the two ends of the resistance layer. The two conductive layers are used as two electrical terminals for connecting the two ends of resistance layer.

10 Claims, 6 Drawing Sheets

METHOD OF FORMING A THIN-FILM RESISTOR IN A SEMICONDUCTOR WAFER

BACKGROUND OF THE INVENTION

1. Field of the Invention

The present invention relates to a method of forming a thin-film resistor, and more particularly, to a method of forming a thin-film resistor in a semiconductor wafer.

2. Description of the Prior Art

In semiconductor integrated circuit design, a simple resistor is often made from a gate conductive layer or an impurity-doped layer in a predetermined area of the semiconductor wafer. However, the resistance typically obtained from the gate conductive layer and the impurity-doped layer is often too low. To obtain a sufficient level of resistance, the surface area of the resistor must be greatly increased. Also, the resistance of the silicon-containing gate conductive layer and impurity doped layer varies with temperature changes which results in instability of the resistance value. Therefore, a stable thin-film resistor with lower conductivity on the semiconductor wafer is needed to meet design requirements.

Please refer to FIG. 1 and FIG. 2. FIG. 1 and FIG. 2 are schematic diagrams of a method of forming a thin-film resistor according to the prior art. A thin-film resistor 20 is formed on a dielectric layer 12 of a semiconductor wafer 10. As shown in FIG. 1, a thin-film resistor 20 is produced by first sequentially forming a resistance layer 14 and a protective layer 16 in a predetermined area on the surface of the dielectric layer 12. Then, a conductive layer 18 made of an aluminum alloy is formed on the protective layer 16. Next, a large portion of the conductive layer 18 and protective layer 16 positioned on the resistance layer 14 is removed by wet-etching with the remaining portion at the two ends of the resistance layer 14 functioning as two electrical terminals of the two ends of the resistance layer 14. This is illustrated in FIG. 2.

The wet-etching process is an isotropic etching process with equal horizontal and vertical etching depths. To define the conductive layer 18 properly through wet etching, the surface area of the resistance layer 14 and the protective layer 16 must be large. Only if the resistance layer 14 and protective layer 16 is large can a large portion of the conductive layer 18 and protective layer 16 be removed while still preserving the two portions at the ends of the resistance layer 14. Although this method can be utilized in processing gate widths greater than 3 micrometers, it is ineffective in processing narrower gate widths.

SUMMARY OF THE INVENTION

It is therefore a primary objective of the present invention to provide a method of forming a thin-film resistor in a semiconductor wafer with much more stable resistance. Also, the method is utilized in gate processing for forming narrower gates.

In a preferred embodiment, the present invention provides a method of forming a thin-film resistor on a dielectric layer of a semiconductor wafer, the method comprising:

forming a resistance layer, a buffering layer and a protective layer in a predetermined area of the dielectric layer, the buffering layer being positioned on the resistance layer and below the protective layer for buffering the effect of thermal stress exerted on the resistance layer by the protective layer;

forming an insulating layer on the semiconductor wafer to cover the upper and side surface of the protective layer, the side surface of the buffering layer and the resistance layer, and the surface of the dielectric layer outside the predetermined area;

performing a dry-etching process on the insulating layer to form two openings extending down to the protective layer over which the protective layer is used for protecting the resistance layer from plasma damage caused by the dry-etching process;

performing a first wet-etching process on the protective layer below the two openings of the insulating layer to form two openings extending down to the buffering layer;

performing a second wet-etching process on the buffering layer below the two openings of the protective layer to form two openings extending down to the resistance layer; and forming two conductive layers in the two openings of the insulating layer, the protective layer and the buffering layer to contact the two ends of the resistance layer wherein the two conductive layers are used as two electrical terminals for connecting the two ends of resistance layer.

It is an advantage of the present invention that the thin-film resistor thus formed comprises a resistance layer below a buffering layer and a protective layer. The buffering layer buffers the thermal stress exerted on the resistance layer and the protective layer protects the resistance layer from plasma damage. The resulting thin-film resistor has a much more stable resistance.

This and other objective of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
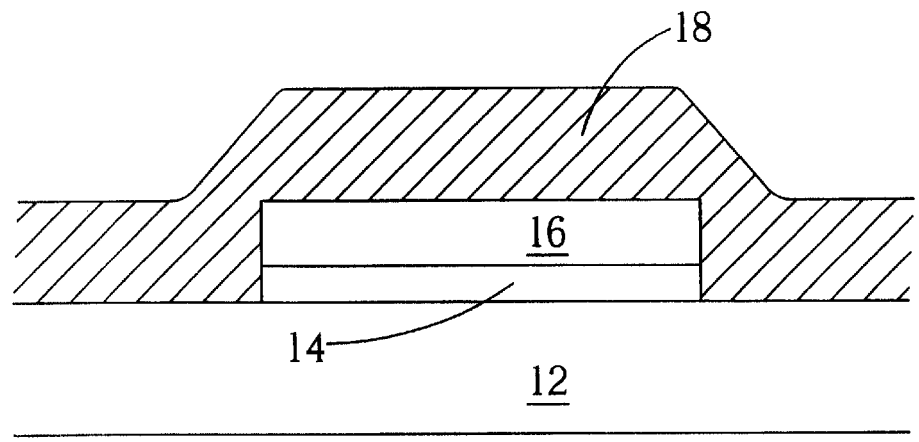
FIG. 1 is a schematic diagram of a method of forming a thin-film resistor according to the prior art.
Figure 2:
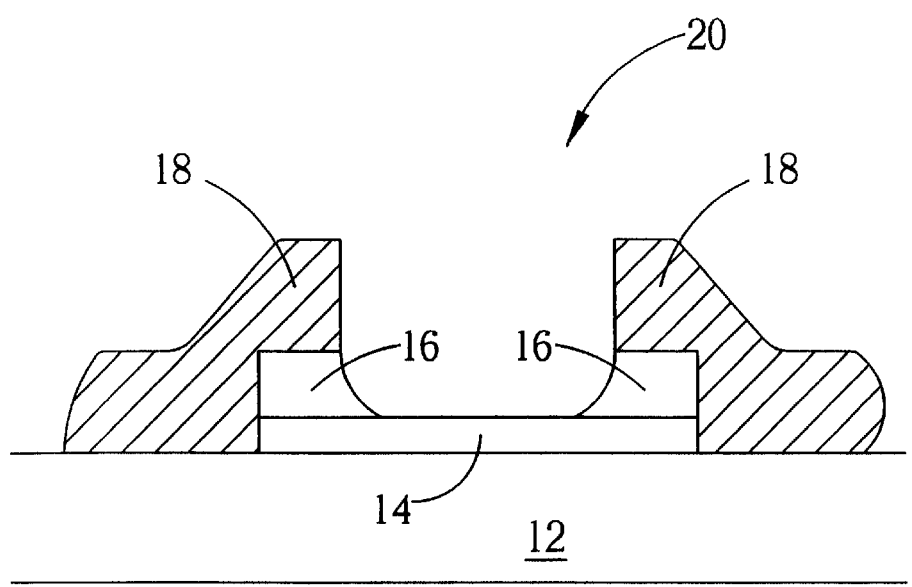
Figure 3:
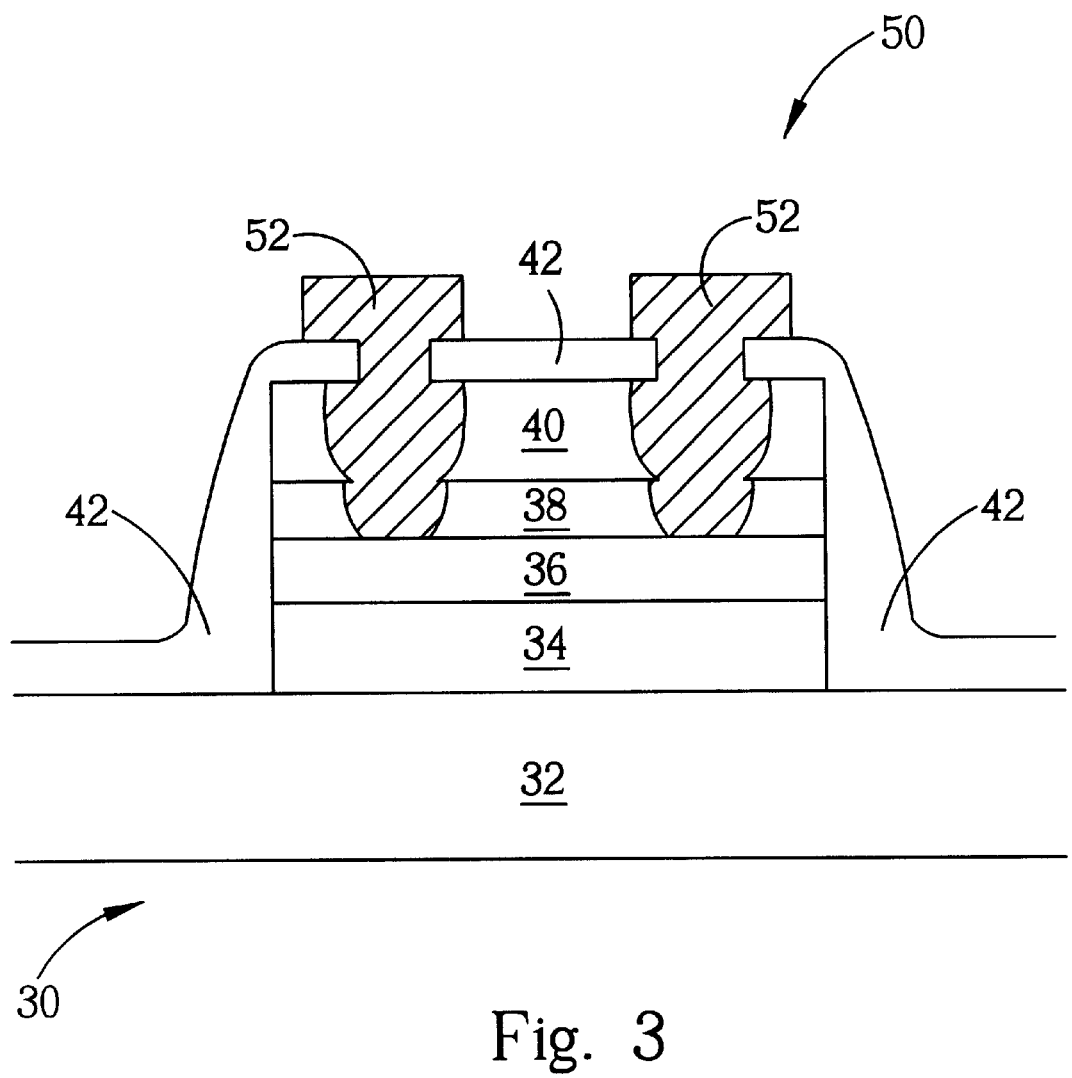
FIG. 3 is a sectional schematic diagram of a thin-film resistor according to the present invention.

Please refer to FIG. 3. FIG. 3 is a sectional schematic diagram of a thin-film resistor 50 according to the present invention. The thin-film resistor 50 formed on a semiconductor wafer 30 comprises a dielectric layer 32, an isolating layer 34, a resistance layer 36, a buffering layer 38, a protective layer 40, an insulating layer 42 and two conductive layers 52. The dielectric layer 32 is positioned on the semiconductor wafer 30. The isolating layer 34 is positioned in a predetermined area of the dielectric layer 32. The resistance layer 36 is positioned on the isolating layer 34 within the predetermined area. The buffering layer 38 is positioned on the resistance layer 36 within the predetermined area and comprises two openings 48 above two opposite ends of the resistance layer 36. The protective layer 40 is positioned on the buffering layer 38 within the predetermined area and comprises two openings 46 above the two openings 48 of the buffering layer 38. The insulating layer 42 is formed on the semiconductor wafer 30 and covers the upper and side surface of the protective layer 40, the side surface of the buffering layer 38 and the resistance layer 36, and the surface of the dielectric layer 32 outside of the predetermined area. The two conductive layers 52 are separately positioned in the two openings 46 and 48 of the buffering layer 38, protective layer 40 and insulating layer 42 and connects the two ends of resistance layer 36. Thus, the two conductive layers 52 are used as two electric terminals of the two ends of the resistance layer 36.

Figure 4:
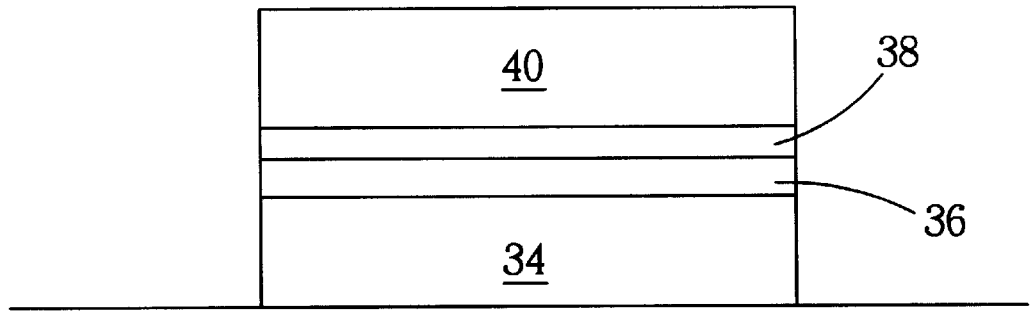
FIG. 4 to FIG. 8 are schematic diagrams of a method of forming the thin-film resistor as shown in FIG. 3.
Figure 5:
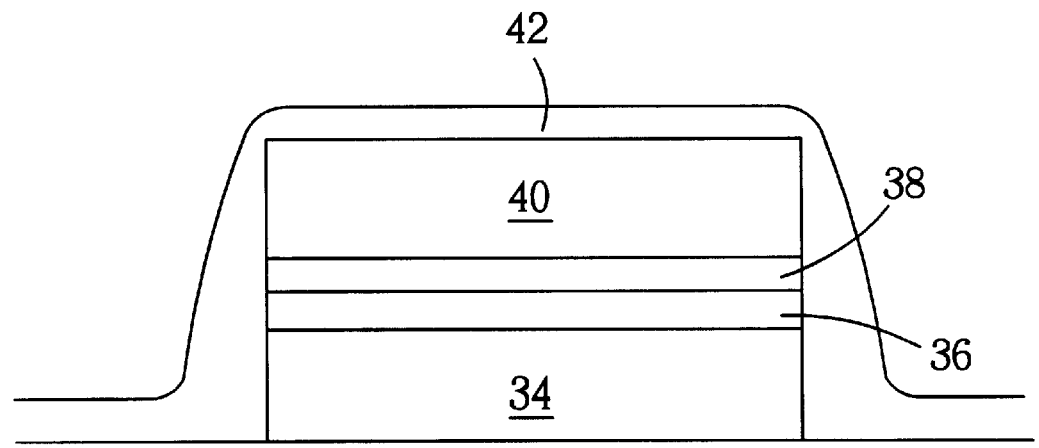

Please refer to FIG. 4 to FIG. 8. FIG. 4 to FIG. 8 are schematic diagrams of a method of forming the thin-film resistor 50 as shown in FIG. 3. The thin-film resistor 50 is formed on the dielectric layer 32 positioned on the surface of the semiconductor wafer 30. The dielectric layer is formed of borophosphosilicate glass (BPSG). In forming the thin-film resistor 50, the isolating layer 34 formed of silicon nitride (SiN) or silicon oxide is formed on the dielectric layer 32 first. The resistance layer 36 formed of SiCr (chromium silicon) is then formed on the isolating layer 34. Next, the buffering layer 38 formed of silicon oxide and the protective layer 40 formed of silicon nitride are formed on the resistance layer 36 in order by using a chemical vapor deposition (CVD) method. Later, the protective layer 40, the buffering layer 38, the resistance layer 36 and the isolating layer 34 outside the predetermined area are removed by performing an anisotropic dry-etching process as shown in FIG. 4. Afterward, the insulating layer 42 formed of silicon oxide is formed on the semiconductor wafer 30 by the CVD method as shown in FIG. 5. The insulating layer 42 covers the upper and side surfaces of the protective layer 40, the side surface of the buffering layer 38, the resistance layer 36 and the isolating layer 34, and the surface of the dielectric layer 32 outside of the predetermined area.

Figure 6:
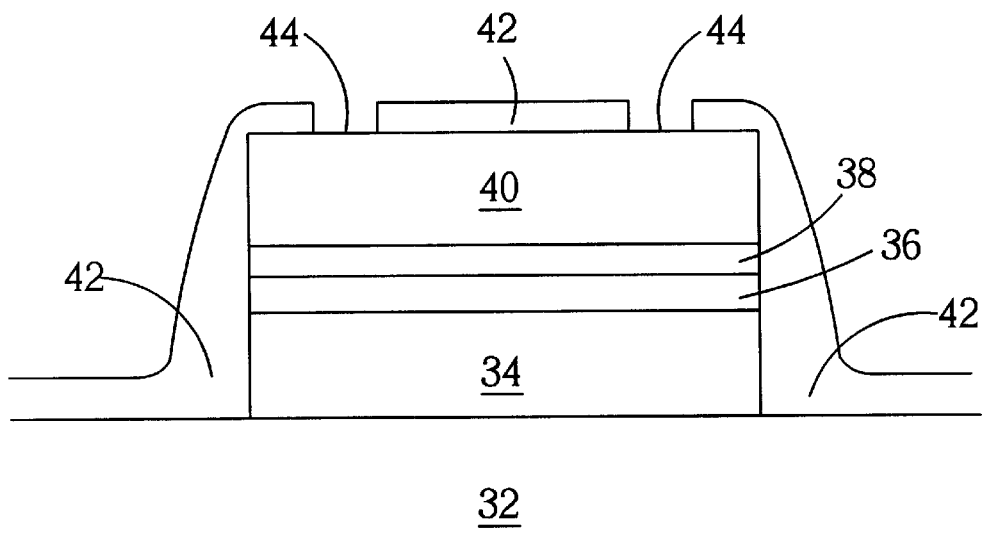
Figure 7:
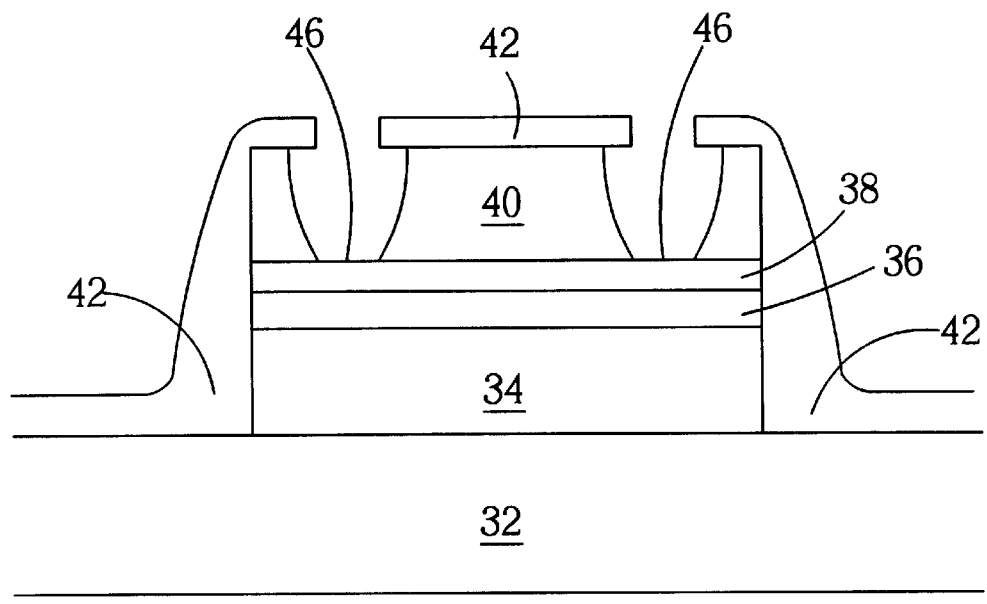
Figure 8:
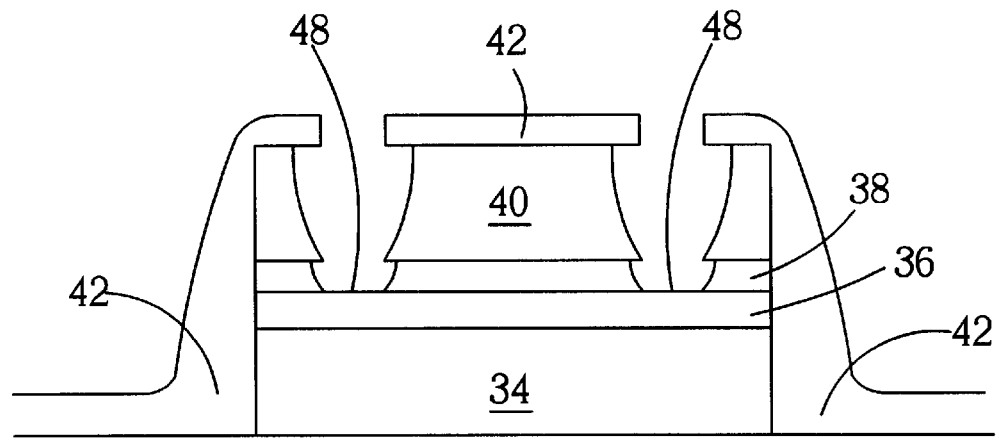

Next, two openings 44 extending down to the protective layer 40 are formed in the insulating layer 42 by performing a dry-etching process as shown in FIG. 6. Then, two openings 46 extending down to the buffering layer 38 are formed in the protective layer 40 by performing a first wet-etching process as shown in FIG. 7. The first wet-etching process employs phosphoric acid ($H_3PO_4$) as the etching solution. Next, two openings 48 extending down to the resistance layer 36 are formed in the buffering layer 38 below the two openings 46 of the protective layer 40 by performing a second wet-etching process as shown in FIG. 8. The second wet-etching process employs a buffered oxide etcher (BOE) as the etching solution. Finally, the two conductive layers 52 are separately formed in the two openings which are formed of the three openings 44, 46, 48 of the insulating layer 42, the protective layer 40, and the buffering layer 38 for connecting the two ends of the resistance layer 36 as shown in FIG. 8. The two conductive layers 52 function as electrical terminals of the two ends of the resistance layer 36. The isolating layer 34 is employed to isolate out-gassing produced from borophosphosilicate glass of the dielectric 32 such that the out-gassing does not affect the resistance of the thin-film resistor 50. The buffering layer 38 is used to buffer the effect of thermal stress exerted on the resistance layer 36 by the protective layer 40. The protective layer 40 is used to protect the resistance layer 36 from plasma damage caused by the dry-etching process. Therefore, the resistance of the thin-film resistor 50 is very stable. Also, in the formation of two electrically connected channels above the two ends of the resistance layer 36, the two openings 44 in the insulating layer 42 are formed through dry etching prior to forming the two openings 46, 48 through wet etching that extend down to the buffering layer 38 and the resistance layer 36. Hence, the two conductive layers 52 formed in the two channels do not occupy too large of a surface area on the thin-film resistor 50. Also, the method of forming the thin-film resistor 50 can be utilized to perform the narrower gate process for reducing the area of the semiconductor product.

Figure 9:
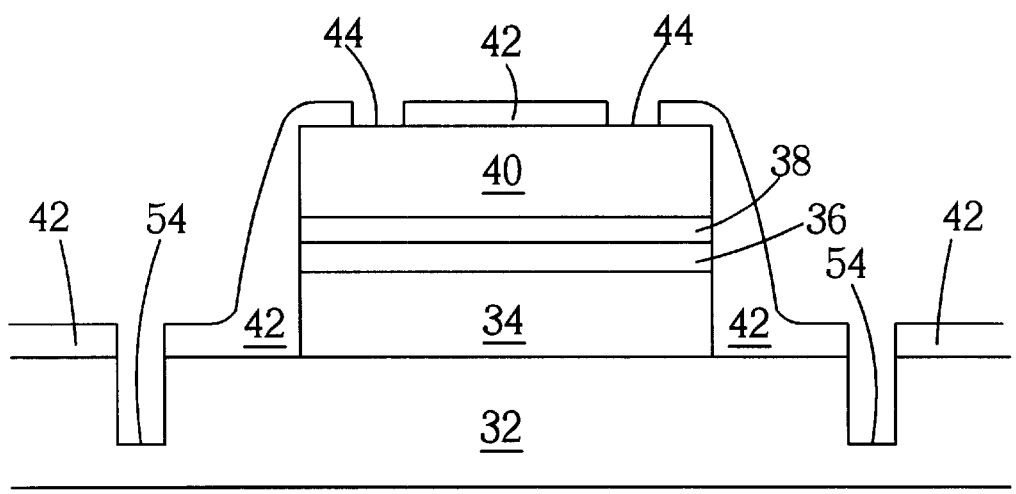
FIG. 9 to FIG. 11 are schematic diagrams of an alternative embodiment according to the present invention.
Figure 10:
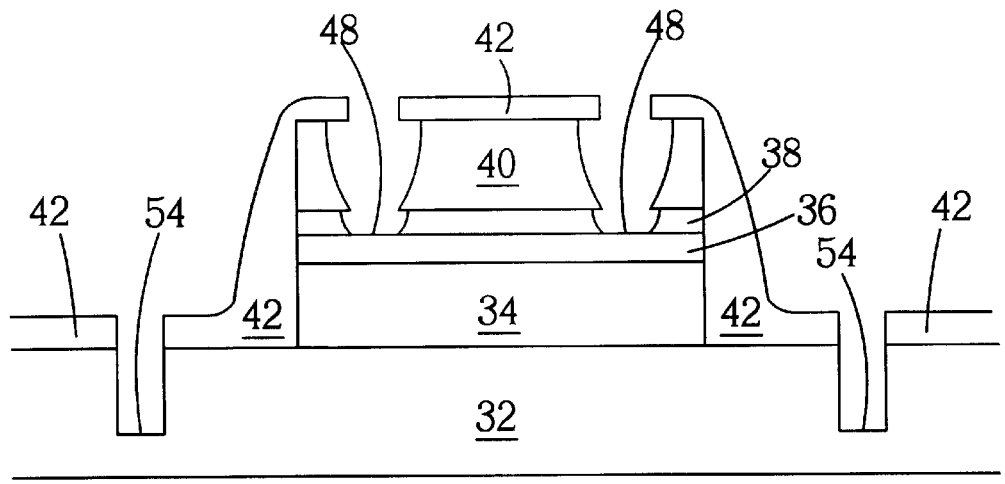
Figure 11:
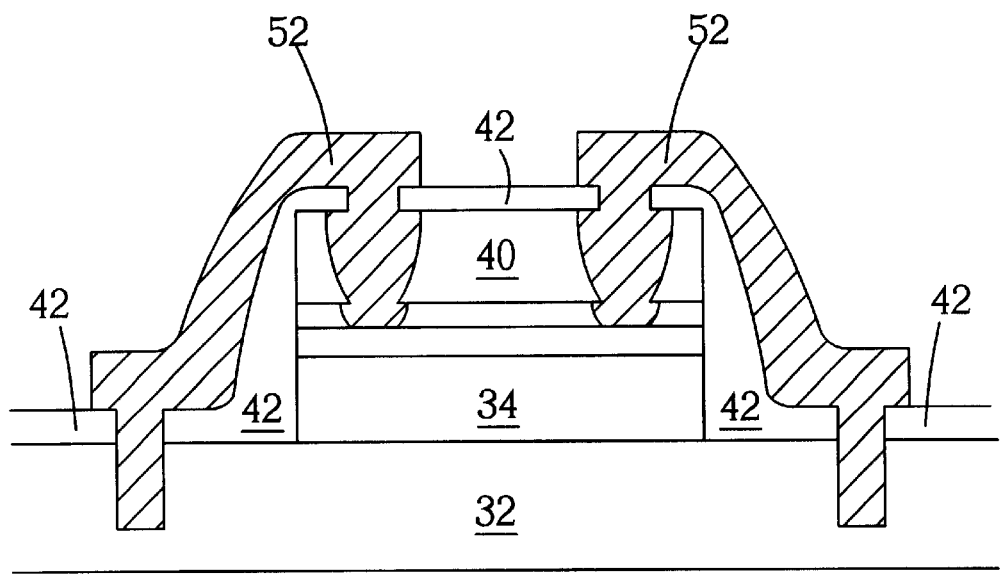

Please refer to FIG. 9 to FIG. 11. FIG. 9 to FIG. 11 are schematic diagrams of an alternative embodiment according to the present invention. During the formation of the thin-film resistor 50, a contact hole can also be formed on the semiconductor wafer 30 outside the predetermined area for electrically connecting the devices within the semiconductor wafer 30. While forming the two openings 44 on the insulating layer 42 through dry-etching in the previously described process of forming the thin-film resistor 50, two contact holes 54 can also be formed on the dielectric layer 32 and the insulating layer 42 outside of the predetermined area as shown in FIG. 9. Next, the two openings 46 and 48 that extend down to the resistance layer 36 are formed by performing the first wet-etching process and the second wet-etching process in sequence as shown in FIG. 10. Finally, two third conductive layers 52 are formed in the two contact holes 54 and in the two openings extending to the resistance layer 36 at the same time. The third conductive layers 52 in the two contact holes 54 separately connect one of the two electrical terminals on the two ends of the resistance layer 36 across the surface of the insulating layer 42.

Compared to the prior art of the thin-film resistor 20, in the method of forming the thin-film resistor 50 of the present invention, the two openings extending down to the resistance layer 36 are formed by performing the dry-etching process on the insulating layer 42 first and then performing the wet-etching process twice on the protective layer 40 and the buffering layer 38. Next, the two conductive layers 52 are separately formed in the two openings as the two electrical terminals of the two ends of the resistance layer 36. The buffering layer 38 buffers the effect of thermal stress exerted on the resistance layer 36 by the protective layer 40. The protective layer 40 protects the resistance layer 36 from plasma damage caused by the dry-etching process. Therefore, the resistance of the thin-film resistor 50 is very stable. Also, the method is suitable for use in processing narrow gates.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming a thin-film resistor on a dielectric layer of a semiconductor wafer comprising:

forming an isolating layer, a resistance layer, a buffering layer and a protective layer in a predetermined area of the dielectric layer, the buffering layer being positioned on the resistance layer and below the protective layer for buffering the effect of thermal stress exerted on the resistance layer by the protective layer;

forming an insulating layer on the semiconductor wafer to cover the upper and side surface of the protective layer, the side surface of the buffering layer and the resistance layer, and the surface of the dielectric layer outside the predetermined area;

performing a dry-etching process on the insulating layer to form two openings extending down to the protective layer over which the protective layer is used for protecting the resistance layer from plasma damage caused by the dry-etching process;

performing a first wet-etching process on the protective layer below the two openings of the insulating layer to form two openings extending down to the buffering layer;

performing a second wet-etching process on the buffering layer below the two openings of the protective layer to form two openings extending down to the resistance layer; and forming two conductive layers in the two openings of the insulating layer, the protective layer and the buffering layer to contact the two ends of the resistance layer wherein the two conductive layers are used as two electrical terminals for connecting the two ends of resistance layer.

2. The method of claim 1 wherein the resistance layer, the buffering layer and the protective layer are formed in the predetermined area according to the following steps:

forming the resistance layer on the dielectric layer;

forming the buffering layer on the resistance layer;

forming the protective layer on the buffering layer; and performing an anisotropic dry-etching process to remove the portions of the resistance layer, the buffering layer and the protective layer outside the predetermined area.

3. The method of claim 1 wherein the resistance layer is formed of SiCr (chromium silicon), the buffering layer is formed of silicon oxide by using a chemical vapor deposition method, the protective layer is formed of silicon nitride, and the insulating layer is formed of silicon oxide by using a chemical vapor deposition method.

4. The method of claim 3 wherein the first wet-etching process employs phosphoric acid ($H_3PO_4$) as the etching solution.

5. The method of claim 3 wherein the second wet-etching process employs a buffered oxide etcher (BOE) as the etching solution.

6. The method of claim 1 wherein the dielectric layer is formed of borophosphosilicate glass (BPSG).

7. The method of claim 6 wherein the isolating layer is used to isolate the out-gassing produced from borophosphosilicate glass of the dielectric such that the out-gassing does not affect the resistance of the thin-film resistor.

8. The method of claim 7 wherein the isolating layer is formed of silicon nitride or silicon oxide.

9. The method of claim 1 wherein the dry-etching process is also used to create a contact hole over the insulating layer and the dielectric layer outside the predetermined area.

10. The method of claim 9 wherein a third conductive layer is formed in the contact hole at the same time when the two conductive layers are formed in the two openings in the predetermined area, and the third conductive layer in the contact hole is used for connecting one of the two conductive layers electrically connected to the resistance layer across the surface of the insulating layer.

* * * * *